United States Patent
Suzuki et al.

(10) Patent No.: US 12,211,676 B2
(45) Date of Patent: Jan. 28, 2025

(54) MEASUREMENT SYSTEM, MEASUREMENT METHOD, AND PLASMA PROCESSING DEVICE

(71) Applicant: TOKYO ELECTRON LIMITED, Tokyo (JP)

(72) Inventors: Ayuta Suzuki, Yamanashi (JP); Hidefumi Matsui, Yamanashi (JP); Atsushi Kubo, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 231 days.

(21) Appl. No.: 17/760,182

(22) PCT Filed: Jan. 29, 2021

(86) PCT No.: PCT/JP2021/003205
§ 371 (c)(1),
(2) Date: Aug. 4, 2022

(87) PCT Pub. No.: WO2021/161804
PCT Pub. Date: Aug. 19, 2021

(65) Prior Publication Data
US 2023/0062662 A1    Mar. 2, 2023

(30) Foreign Application Priority Data
Feb. 12, 2020    (JP) .................................. 2020-021614

(51) Int. Cl.
*H01J 37/32*    (2006.01)
*G01J 5/00*    (2022.01)

(52) U.S. Cl.
CPC ....... *H01J 37/32917* (2013.01); *G01J 5/0018* (2013.01); *H01J 2237/24592* (2013.01)

(58) Field of Classification Search
CPC ........... H01J 37/32917; H01J 37/32935; G01J 5/0018; G01J 3/0248; G01J 3/443; G01N 21/68
See application file for complete search history.

(56) References Cited

U.S. PATENT DOCUMENTS 6,482,669 B1 *  11/2002  Fan .................. H01L 27/14685
                                                           438/70
9,583,318 B2     2/2017  Miura et al.
(Continued)

FOREIGN PATENT DOCUMENTS

JP    2005116217 A  *  4/2005
JP    2018-66865 A     4/2018
(Continued)

OTHER PUBLICATIONS

PCT International Search Report, PCT Application No. PCT/JP2021/003205, Apr. 6, 2021, 9 pages.

*Primary Examiner* — Tarifur R Chowdhury
*Assistant Examiner* — Roberto Fabian, Jr.
(74) *Attorney, Agent, or Firm* — Fenwick & West LLP

(57) ABSTRACT

A measurement system including an imaging device and a plasma processing device having a plasma generator configured to generate plasma from a gas supplied into a processing chamber and a controller. The imaging device is configured to generate optical information of the plasma from image data of imaged plasma in the processing chamber, and the controller is configured to convert the generated optical information of the plasma into a plasma parameter that determines physical characteristics of the plasma with reference to a storage that stores correlation information between the optical information of the plasma and measurement results of the plasma parameter.

9 Claims, 9 Drawing Sheets

(56) References Cited

U.S. PATENT DOCUMENTS

| | | | |
|---|---|---|---|
| 10,249,485 B2 | 4/2019 | Volynets et al. | |
| 11,287,782 B2 | 3/2022 | Ohmori et al. | |
| 2005/0217794 A1* | 10/2005 | Kagoshima | H01J 37/32935 |
| | | | 156/345.24 |
| 2010/0131226 A1* | 5/2010 | Takizawa | H01J 37/32926 |
| | | | 374/161 |
| 2013/0013253 A1* | 1/2013 | Samukawa | H01J 37/32935 |
| | | | 702/167 |
| 2013/0133832 A1* | 5/2013 | Kuboi | H01J 37/32963 |
| | | | 703/2 |
| 2016/0293390 A1 | 10/2016 | Miura et al. | |
| 2018/0130651 A1 | 5/2018 | Volynets et al. | |
| 2019/0064755 A1 | 2/2019 | Ohmori et al. | |

FOREIGN PATENT DOCUMENTS

| | | |
|---|---|---|
| JP | 2019-45299 A | 3/2019 |
| KR | 10-2016-0117221 A | 10/2016 |
| KR | 10-2018-0052306 A | 5/2018 |
| KR | 10-2019-0024597 A | 3/2019 |

\* cited by examiner

FIG.5

| PROCESS CONDITION | | LUMINANCE | | | PLASMA EMISSION INTENSITY | Ne | Te |
|---|---|---|---|---|---|---|---|
| | GAS | R | G | B | | | |
| | Ar | $R_1$ | $G_1$ | $B_1$ | $L_1$ | $N_1$ | $T_1$ |
| | $N_2$ | $R_2$ | $G_2$ | $B_2$ | $L_2$ | $N_2$ | $T_2$ |
| | $O_2$ | $R_3$ | $G_3$ | $B_3$ | $L_3$ | $N_3$ | $T_3$ |
| | $Ar/O_2$ | $R_4$ | $G_4$ | $B_4$ | $L_4$ | $N_4$ | $T_4$ |
| | $Ar/H_2$ | $R_5$ | $G_5$ | $B_5$ | $L_5$ | $N_5$ | $T_5$ |
| | $SiH_4/NH_3$ | $R_6$ | $G_6$ | $B_6$ | $L_6$ | $N_6$ | $T_6$ |
| | $TEOS/O_2$ | $R_7$ | $G_7$ | $B_7$ | $L_7$ | $N_7$ | $T_7$ |
| GAS | PRESSURE | | | | | | |
| | $P_1$ | $R_8$ | $G_8$ | $B_8$ | $L_8$ | $N_8$ | $T_8$ |
| Ar | $P_2$ | $R_9$ | $G_9$ | $B_9$ | $L_9$ | $N_9$ | $T_9$ |
| | $P_3$ | $R_{10}$ | $G_{10}$ | $B_{10}$ | $L_{10}$ | $N_{10}$ | $T_{10}$ |
| | ... | ... | ... | ... | | | |

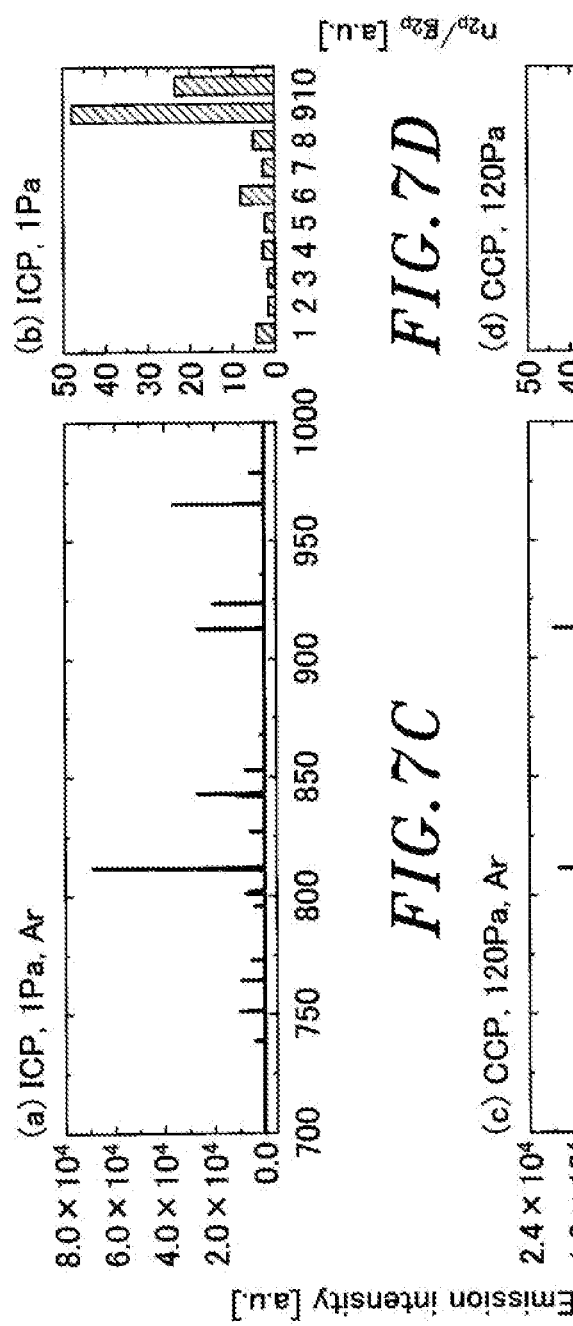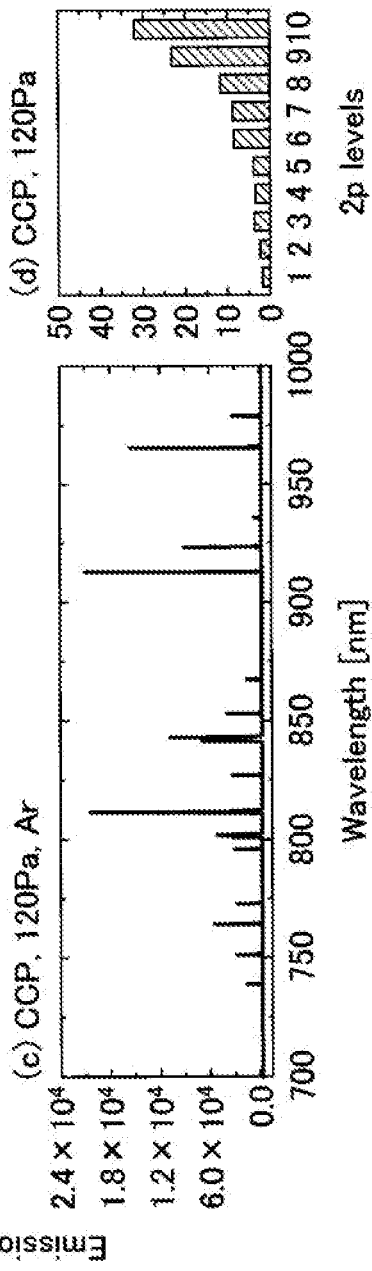

*FIG.8A*  *FIG.8B*
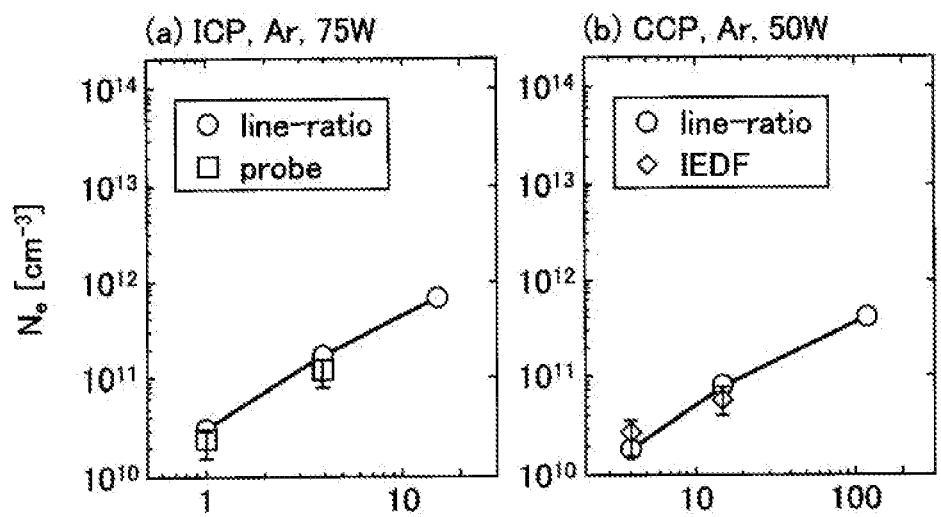
*FIG.8C*  *FIG.8D*
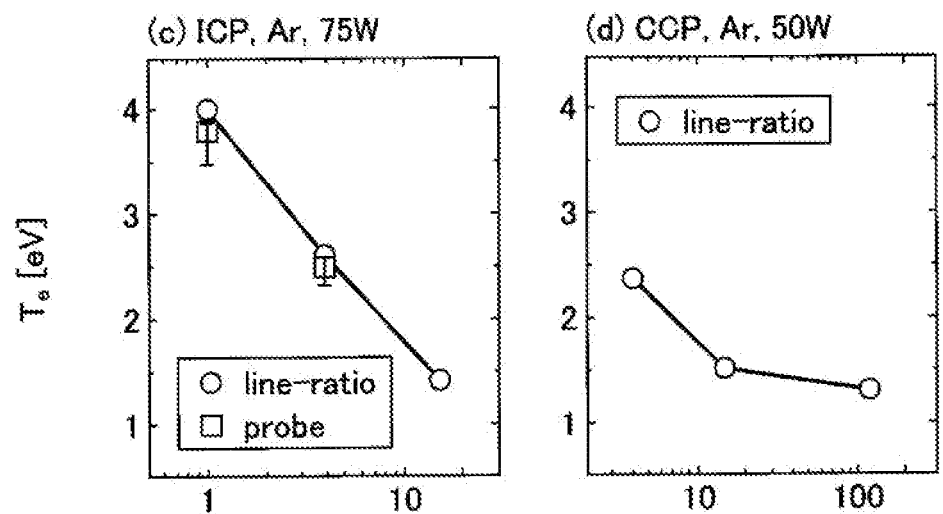

MEASUREMENT SYSTEM, MEASUREMENT METHOD, AND PLASMA PROCESSING DEVICE

TECHNICAL FIELD

The present disclosure relates to a measurement system, a measurement method, and a plasma processing device.

BACKGROUND

Patent Document 1 proposes a three-dimensional information acquisition device capable of acquiring three-dimensional information of an object, without requiring a complicated configuration or complicated calculation, using the principle of optical integral photography.

Patent Document 2 proposes a lithography apparatus for performing refocus calculation for reconstituting a plurality of image data having different positions of focusing direction based on the light field image data. Patent Document 2 proposes a technique for adjusting the position of at least one of an original plate holding part and a substrate holding part based on a plurality of image data reconstituted by the refocus calculation.

PRIOR ART DOCUMENTS

Patent Documents

Patent Document 1: Japanese Laid-open Patent Publication No. 2019-45299
Patent Document 2: Japanese Laid-open Patent Publication No. 2018-66865

SUMMARY

Problems to Be Resolved by the Invention

This disclosure provides a technique for easily acquiring plasma parameters.

Means for Solving the Problem

One exemplary embodiment provides a measurement system including an imaging device and a plasma processing device having a plasma generator configured to generate plasma from a gas supplied into a processing chamber and a controller, wherein the imaging device is configured to generate optical information of the plasma from image data of imaged plasma in the processing chamber, and the controller is configured to convert the generated optical information of the plasma into a plasma parameter that determines physical characteristics of the plasma with reference to a storage that stores correlation information between the optical information of the plasma and measurement results of the plasma parameter.

Effect of the Invention

In accordance with one aspect, plasma parameters can be easily acquired.

BRIEF DESCRIPTION OF THE DRAWINGS

FIG. 5 shows an example of optical information and measurement results of plasma parameters according to an embodiment.

FIGS. 7A to 7D are graphs showing an example of correlation between optical information and plasma parameters according to an embodiment.

FIGS. 8A to 8D are graphs showing an example of correlation between optical information and plasma parameters according to an embodiment.

DETAILED DESCRIPTION

Figure 1:
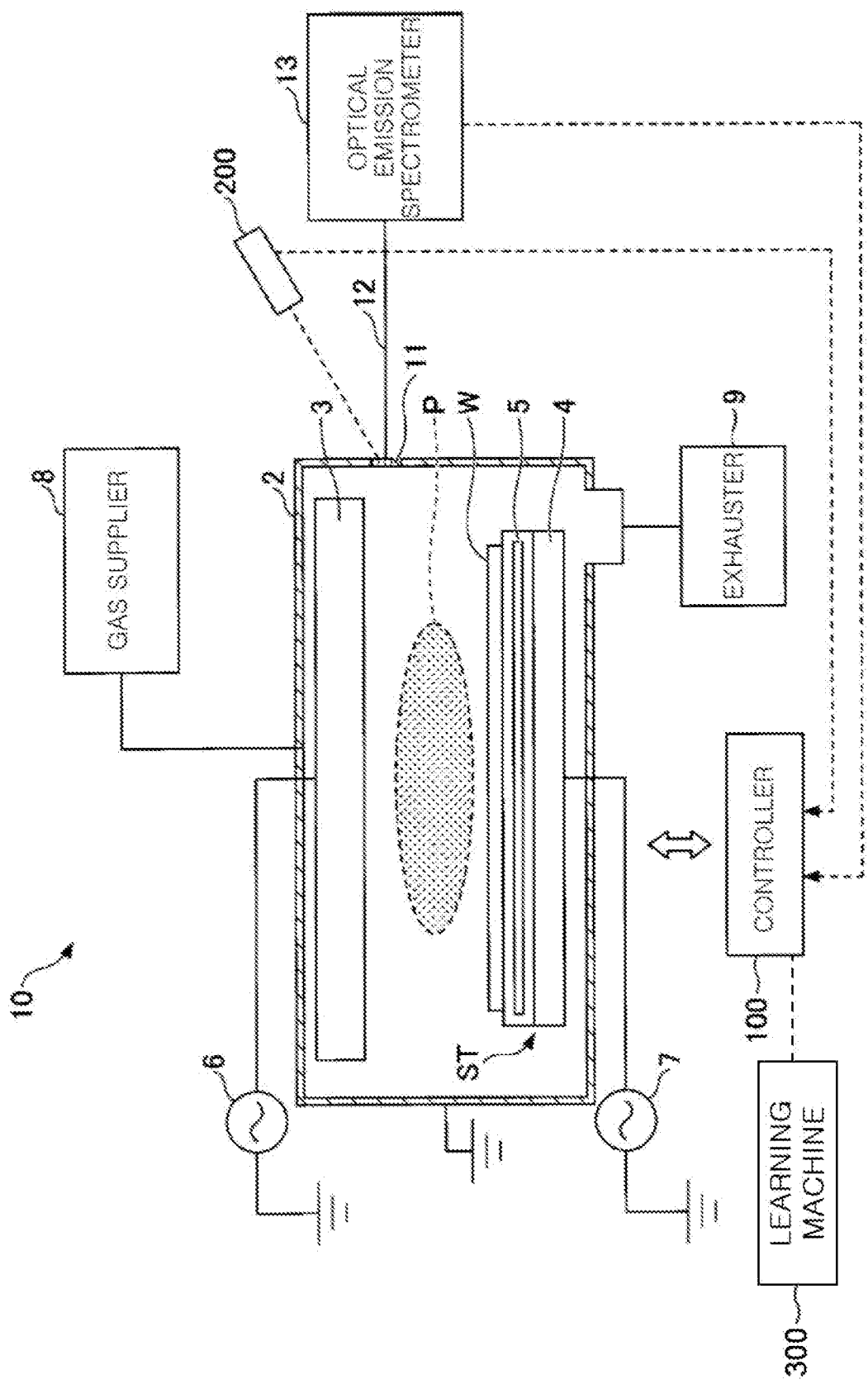
FIG. 1 shows a plasma processing device according to an embodiment.

Hereinafter, embodiments of the present disclosure will be described with reference to the accompanying drawings. Like reference numerals will be given to like or corresponding parts throughout the drawings, and redundant description thereof will be omitted.

<Measurement System>

First, a measurement system including a plasma processing device 10 and an imaging device 200 will be described with reference to FIG. 1. FIG. 1 shows an example of the measurement system including the plasma processing device 10 and the imaging device 200 according to an embodiment.

The plasma processing device 10 provides an example of several plasma generation systems used to excite plasma from a processing gas. The plasma processing device 10 of FIG. 1 is a capacitively coupled plasma (CCP) device, and plasma P is generated between an upper electrode 3 in a processing chamber 2 and a stage ST. The stage ST includes a lower electrode 4 and an electrostatic chuck 5. During processing, the substrate W is held on the lower electrode 4. A viewport 11 made of a dielectric material such as quartz or the like is disposed in the processing chamber 2 to transmit light, and an optical emission spectrometer 13 is connected to the viewport 11 through an optical fiber 12. The optical emission spectrometer 13 is an example of a measurement device for measuring plasma.

A first radio frequency (RF) power supply 6 is connected to the upper electrode 3, and a second RF power supply 7 is connected to the lower electrode 4. The first RF power supply 6 and the second RF power supply 7 may use different RF frequencies. Both the first RF power supply 6 and the second RF power supply 7 may be coupled to the lower electrode 4. Further, a direct current (DC) power supply may be coupled to the upper electrode 3. A gas supplier 8 is connected to the processing chamber 2 to supply a processing gas. Further, an exhauster 9 is connected to the processing chamber 2 to exhaust a gas in the processing chamber 2.

The plasma processing device 10 includes a controller 100. The controller 100 controls individual components of the plasma processing device 10 to perform plasma processing such as film formation, etching, or the like on the substrate W.

The plasma processing device 10 includes another measurement device, in addition to the optical emission spectrometer 13 or instead of the optical emission spectrometer 13, to measure a plasma parameter using various measurement methods. The plasma parameter determines physical properties of plasma. The plasma parameter may include any one of a plasma emission intensity, a plasma density $N_e$, and a plasma temperature $T_e$. The plasma parameter may include any one of a plasma potential, a radical density, and an electron energy distribution function (EEDF).

The measurement methods may include optical measurement, probe measurement, quadrupole mass spectrometry (QMS), and imaging of images (image data). For example, the imaging device 200 images a plasma space through the viewport 11, so that plasma distribution, a sheath thickness, and emission distribution of a specific wavelength can be obtained from the image data. The optical measurement is performed by an optical emission spectrometer (OES), a vacuum ultraviolet absorption spectroscopy (VUVAS), and the like. The optical measurement may be performed by, e.g., a method of measuring an emission intensity of plasma by monitoring emission from plasma using the optical emission spectrometer 13. The optical measurement requires a dedicated measurement device such as the optical emission spectrometer 13, which is expensive and has a large footprint, compared to other measurement methods.

In the probe measurement, a probe is inserted into plasma to measure (actually measure) a plasma parameter such as a plasma density $N_e$, a plasma temperature $T_e$, a plasma potential, an electron energy density, or the like. In the probe measurement, hardware such as a measurement probe is required, and there is a location restriction. A Langmuir probe, a plasma absorption probe (PAP), an ion current probe, an isolated probe, or the like may be used as the probe.

The quadrupole mass spectrometry (QMS) is a technique in which molecules collected from a gas space and charged are separated and detected depending on a mass-to-charge ratio using an electric field. The mass spectrometry is unlikely to be applied to a process space and is generally applied to an exhaust space.

The first RF power supply 6 applies an RF power to the upper electrode 3. Accordingly, plasma is generated from one or more gases supplied to a plasma processing space. The first RF power supply 6 may apply an RF power to the lower electrode 4. Therefore, the first RF power supply 6 can function as at least a part of a plasma generator configured to generate plasma from one or more gases in the processing chamber 2.

Figure 2:
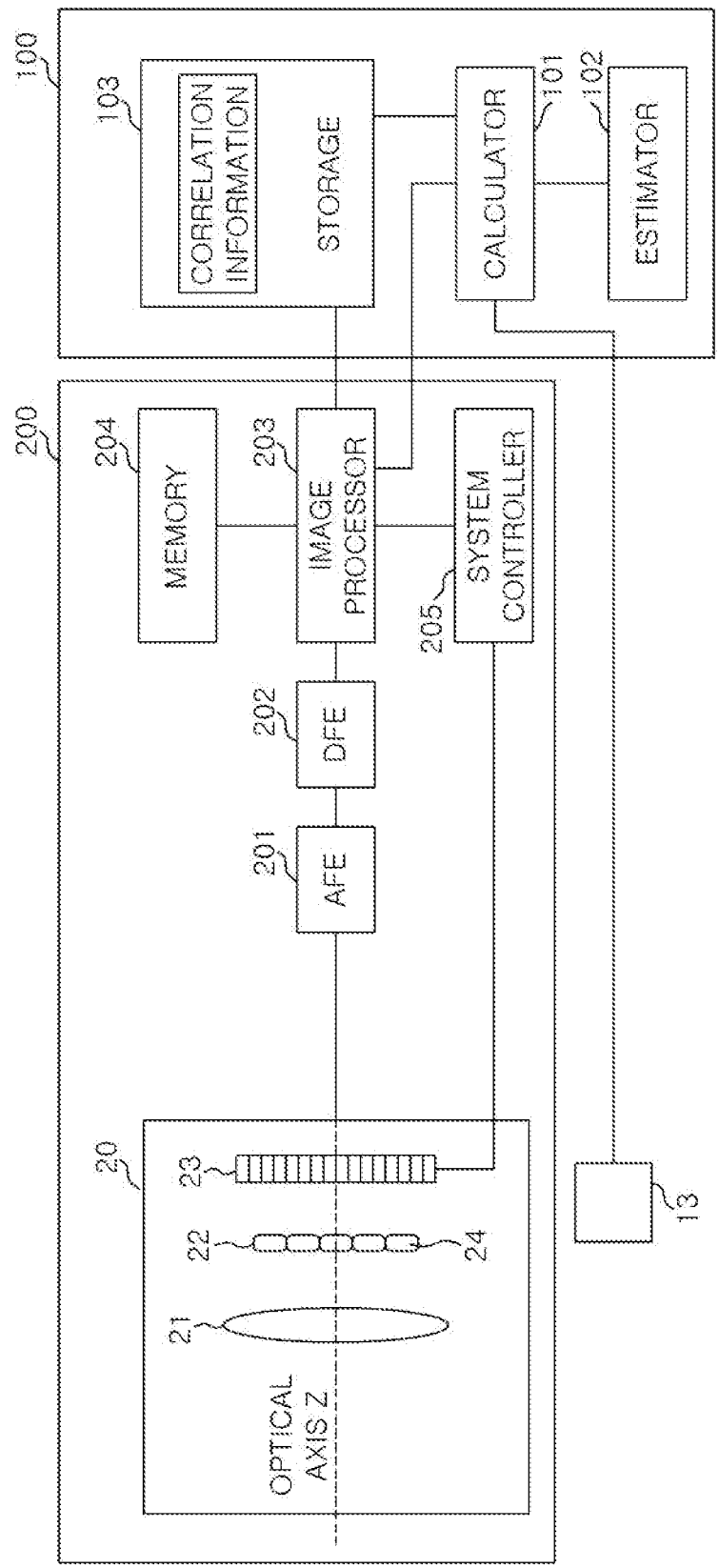
FIG. 2 shows an example of a configuration of an imaging device and a controller according to an embodiment.

The imaging device 200 is, e.g., a multi-viewpoint camera capable of acquiring three-dimensional data using an integral photography technique, and may be, e.g., a light field camera. For example, the imaging device 200 can acquire information on a light incidence direction as well as information on light intensity distribution. As shown in FIG. 2, the imaging device 200 includes an imaging part 20, an analog signal processing circuit (AFE) 201, a digital signal processing circuit (DFE) 202, an image processor 203, a memory 204, and a system controller 205.

In the imaging part 20, a microlens array 22 is disposed between an imaging lens 21 and an imaging element 23, and one microlens 24 corresponds to a plurality of pixels of the imaging element 23. The light that passes through the microlens 24 is incident on the plurality of pixels of the imaging element 23 for each incidence direction. By using the principle of integral photography for a pixel signal thus acquired, it is possible to reconstruct the image data focused on an arbitrary image surface after the imaging. For example, the image data focused on an arbitrary three-dimensional image surface in the plasma processing space indicates the optical information (e.g., luminance of each of RGB) of the plasma P of a desired gas that is generated at an arbitrary point in the plasma processing space.

The light that passes through the imaging lens 21 is imaged near the focal position of the imaging lens 21. The microlens array 22 includes a plurality of microlenses 24, and is disposed near the focal position of the imaging lens 21. Therefore, the microlens array 22 has a function of dividing the light that passes through different regions of the imaging lens 21 for each region and emitting the lights.

The imaging element 23 is a photoelectric conversion element such as a CMOS image sensor or a CCD image sensor. The imaging element 23 is disposed such that a plurality of pixels correspond to the plurality of microlenses 24, respectively. Thus, the imaging element 23 has a function of receiving the lights divided for each region and emitted by the microlenses 24 while maintaining division information, and converting them into image data that can be subjected to data processing. For example, the luminance of each of RGB (Red, Green, and Blue) that are three primary colors of light, which is the image data that can be subjected to data processing, can be converted into a gradation value (e.g., value of 0 to 255).

The configuration of the imaging part 20 is not limited to that shown in FIG. 2 as long as it is an imaging optical system capable of acquiring three-dimensional optical information of the plasma processing space where the plasma P is generated in the processing chamber 2.

With this configuration, the imaging part 20 can image the plasma P in the processing chamber 2 from the viewport 11, and can obtain a three-dimensional image of the plasma processing space while focusing on multiple points including the microlens array 22. The imaging part 20 generates three-dimensional optical information of the plasma from the image data of the imaged plasma.

Hereinafter, the luminance of each of RGB will be described as an example of the optical information. However, the optical information is not limited thereto, and may be any one information among visible light, infrared light, and invisible light. The optical information may be the luminance of each of RGB in the image obtained by the imaging part 20, or may be the information obtained after the luminance of each of RGB is processed by the image processor 203. Further, the optical information is not limited to the luminance of each of RGB, and may be a hue saturation value (HSV) or a hyperspectrum having more wavelength information.

The AFE 201 performs A/D conversion processing on the signal of the image data including the luminance of each of RGB that is outputted from the imaging element 23. The DFE 202 performs digital image data processing on the image data signal outputted from the AFE 201.

The image processor 203 performs desired image data processing on the image data signal outputted from the DFE 202. For example, the image processor 203 may eliminate overlapping of images included in the image data by data processing, and generate image data having a three-dimensional plasma emission intensity. The memory 204 may be a volatile memory that temporarily holds the signal of the image data outputted from the image processor 203, or may be a non-volatile memory. The system controller 205 collectively drives and controls the entire imaging device 200.

The controller 100 has a calculator 101, an estimator 102, and a storage 103. The calculator 101 calculates the correlation information between the luminance of each of RGB in the image data acquired from the imaging device 200 and the plasma emission intensity acquired from the optical emission spectrometer 13, and stores the correlation information in the storage 103 in advance.

The estimator 102 converts the luminance of each of RGB into the plasma emission intensity with reference to the storage 103. The storage 103 is a recording medium such as a volatile memory, a non-volatile memory, or a memory card, and may store the signal of the image data outputted from the imaging device 200 in addition to the correlation information.

The imaging device 200 images the plasma generated while changing gas types or other process conditions, generates the luminance of each of RGB from the imaged image data, calculates the correlation information between the luminance of each of RGB and the measurement results of the plasma emission intensity, and stores the correlation information in the storage 103.

The imaging device 200 newly images the plasma generated from a desired gas, and generates the luminance of each of RGB from the imaged image data. The estimator 102 converts the luminance of each of RGB of the newly imaged image data into the plasma parameter based on the correlation information (hereinafter, referred to as "correlation information corresponding to the desired gas" or simply referred to as "correlation information") between the luminance of each of RGB corresponding to the desired gas and the measurement results of the plasma emission intensity with reference to the storage 103. Accordingly, it is possible to estimate the plasma parameter based on the image data obtained by imaging the plasma without performing the plasma measurement.

Further, the imaging device 200 can generate the optical information of the plasma in each space obtained by dividing the three-dimensional space where the plasma is generated. For example, the imaging device 200 can generate the luminance of each of RGB in each space obtained by dividing the three-dimensional space from the image data of the plasma. Accordingly, the estimator 102 can estimate the plasma parameter in the three-dimensional space from the luminance of each of RGB of the plasma in each space obtained by dividing the three-dimensional space based on the correlation information corresponding to the desired gas with reference to the storage 103. In the embodiment, the correlation information is the information that determines one-dimensional plasma distribution or two-dimensional plasma distribution. However, the correlation information may be the information that determines three-dimensional plasma distribution.

For the plasma processing device 10, there are user needs of measuring the three-dimensional plasma parameter of the plasma P generated in the plasma processing space simply, at a high speed, and without disturbance to monitor a plasma state. However, it is difficult to measure the three-dimensional plasma parameter simply, at a high speed, and without disturbance by the above-mentioned measurement methods (the probe measurement, the optical measurement, the mass spectrometry, and the like). For example, in order to obtain the three-dimensional plasma parameter using the conventional measurement technology, expensive dedicated measurement chambers, jigs, and measurement devices, and a long measurement time are required, which is unlikely to be realized by the conventional device.

Therefore, in the measurement system according to the present embodiment, there is proposed a technique for estimating a three-dimensional plasma parameter simply, at a high speed, and without disturbance by combining the image data of the three-dimensional plasma obtained by the integral photography technique and the plasma measurement technique. Accordingly, in the measurement system according to the present embodiment, the three-dimensional plasma parameter can be estimated without disturbing the plasma by inserting the measurement probe into the plasma, and the three-dimensional plasma measurement can be performed.

However, the measurement method according to the embodiment is not limited to three-dimensional plasma measurement, and may estimate one-dimensional plasma parameter or two-dimensional plasma parameter. Even in the case of estimating one-dimensional plasma parameter or two-dimensional plasma parameter, it is not necessary to insert a probe or the like into the plasma space, and the plasma state can be stably maintained, which is advantageous.

<Measurement Method>
(Calibration Curve Creation Process)

Figure 3:
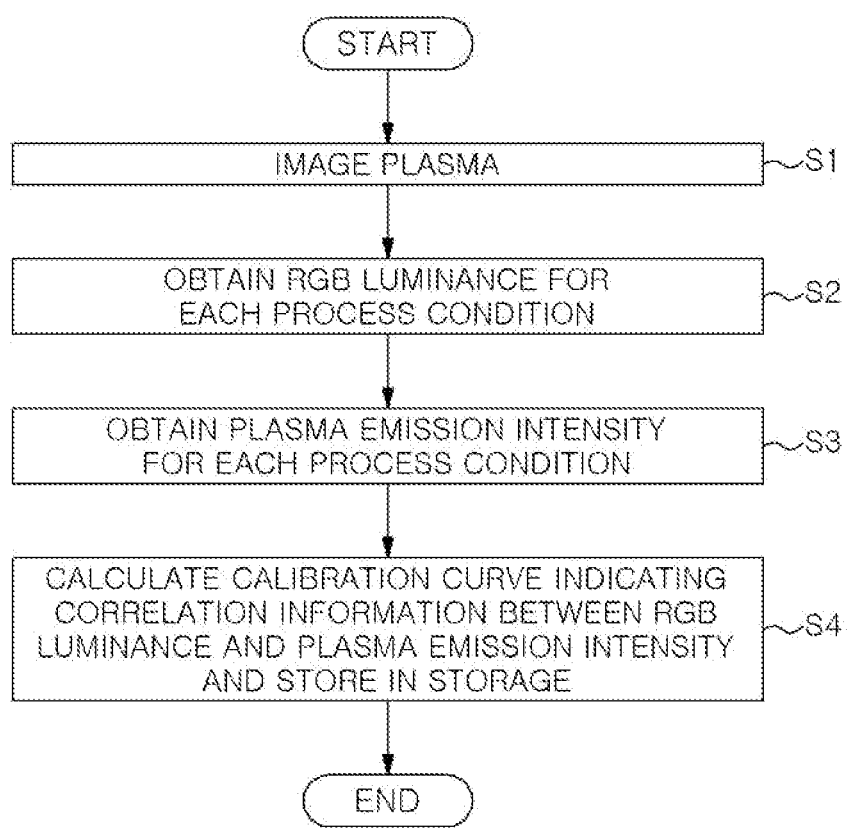
FIG. 3 is a flowchart showing a calibration curve creation process according to an embodiment.
Figure 4A:
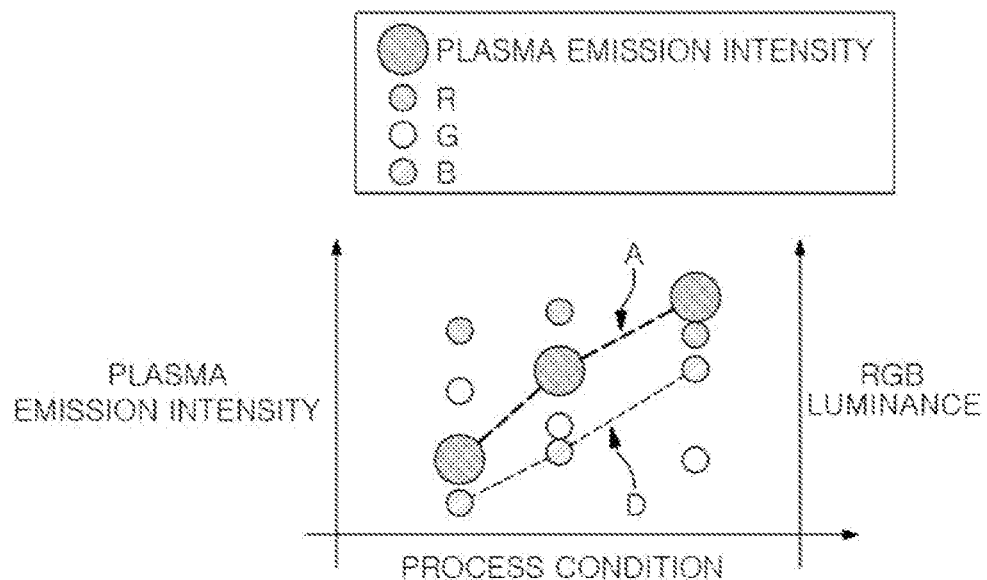
FIGS. 4A and 4B explain calibration curves and three-dimensional plasma parameters according to an embodiment.
Figure 4B:
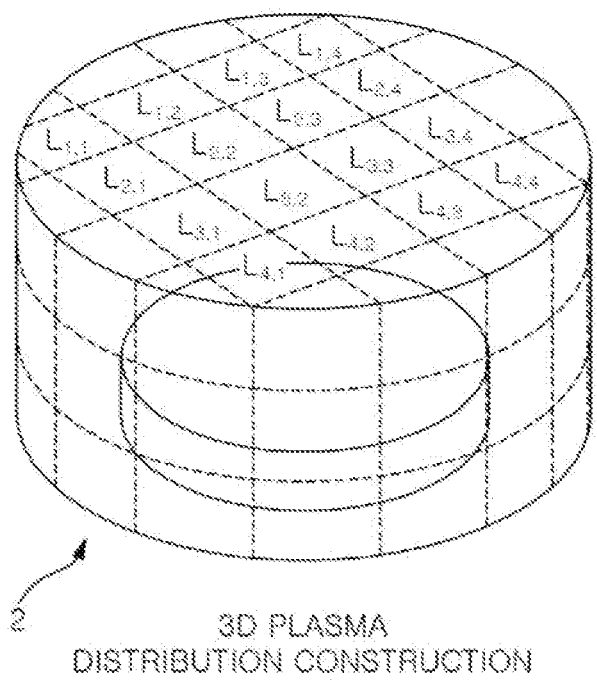
Figure 6:
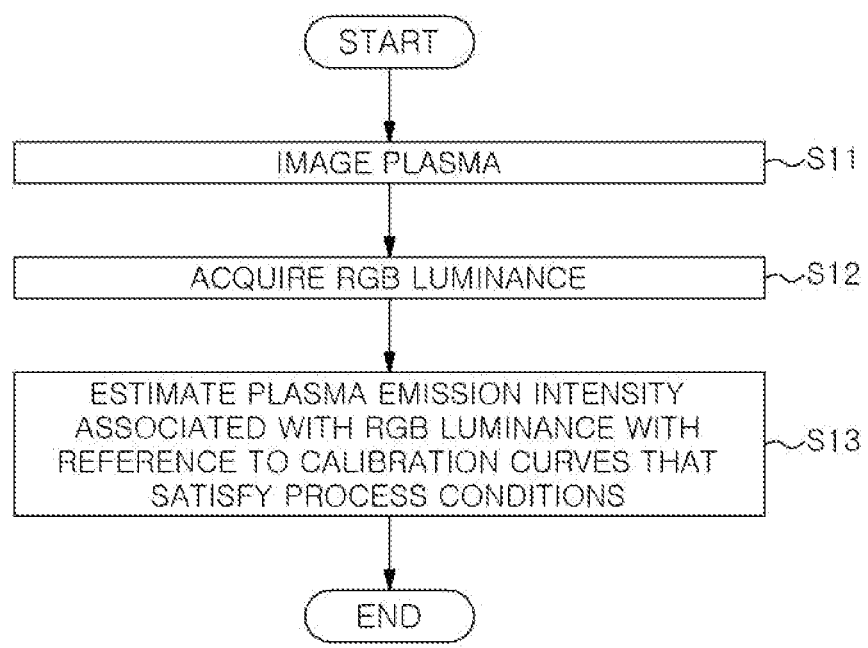
FIG. 6 is a flowchart showing a plasma parameter estimation process according to an embodiment.

Next, the measurement method according to the embodiment will be described with reference to FIGS. 3 to 6. FIG. 3 is a flowchart showing a calibration curve creation process according to the embodiment. FIGS. 4A and 4B explain the calibration curve and the plasma parameter in the three-dimensional space according to the embodiment. FIG. 5 shows an example of optical information and measurement results of plasma parameters according to an embodiment. FIG. 6 is a flowchart showing a plasma parameter estimation process according to an embodiment.

Calibration curves A and D illustrated in FIG. 4A show an example of the correlation information stored in the storage 103, i.e., the correlation information between the optical information of the plasma for each process condition (gas type, or the like) and the measurement result of the plasma parameter for each process condition (gas type, or the like). Various information illustrated in FIG. 5 show an example of the optical information (e.g., RGB luminance) and the information on the measurement results of the plasma parameters (e.g., the emission intensity, the plasma electron density $N_e$, and the plasma electron temperature $T_e$) for each process condition stored in the storage 103.

When the process of FIG. 3 is started, the imaging device 200 allows the imaging part 20 (e.g., light field camera) to image the plasma generated under desired process conditions through the viewport 11, and generates the luminance of each of RGB under the desired process conditions based on the image data of the imaged plasma (step S1). The luminance of each of RGB for each process condition generated in step S1 is transmitted to the controller 100.

The controller 100 (the calculator 101) obtains the luminance of each of RGB for each process condition from the imaging device 200 (step S2). Next, the controller 100 obtains the plasma emission intensity for each process condition that is measured by the optical emission spectrometer 13 (step S3). Next, the controller 100 creates a calibration curve that is an example of the correlation information between the luminance of each of RGB and the plasma emission intensity for each process condition, and stores the correlation information in the storage 103 (step S4). By repeating the process of FIG. 3, the correlation information between the optical information and the plasma parameters corresponding to respective multiple process condition is accumulated in the storage 103.

The process conditions include types of gases supplied into the processing chamber 2, and further include at least one of an RF power, a pressure, a temperature, or a plasma generation method. The RF power may be the RF power applied from the first RF power supply 6 and/or the RF power applied from the second RF power supply 7.

The pressure may be a pressure in the inner space of the processing chamber 2. The temperature in the processing chamber 2 may be, e.g., a temperature of a part in the processing chamber 2, such as a temperature of the stage ST, a temperature of the inner wall of the processing chamber 2, a temperature of the upper electrode 3, or the like. Discharge may be an example of the plasma generation method, but the plasma generation method is not limited thereto. The plasma generation method in the processing chamber 2 may be any one of a capacitively coupled plasma (CCP) generation method, an inductively coupled plasma (ICP) generation method, and a microwave plasma (MWP) generation method. Further, the process conditions may include information indicating changes over time in the processing chamber 2. Accordingly, the plasma parameter can be estimated from the luminance of each of RGB based on the changes over time in the processing chamber 2 as well as the correlation information between the luminance of each of RGB and the plasma emission intensity.

FIG. 4A shows an example of the created calibration curves. The horizontal axis of the graph shown in FIG. 4A indicates the process condition. The process condition may be a gas type or a combination of a gas type and a pressure. The horizontal axis of the graph shown in FIG. 4A may indicate one process condition or a combination of two or more process conditions.

The vertical axis (right side) of the graph shown in FIG. 4A indicates the luminance of each of RGB (red, green, and blue). The vertical axis (left side) of the graph indicates the plasma emission intensity. The luminance of each of RGB (red, green, and blue) shown on the vertical axis (right side) of the graph is an example of the optical information acquired from the imaged image data. The plasma emission intensity shown on the vertical axis (left side) of the graph is an example of the plasma parameter and is an example of the plasma measurement results.

For example, the calculator 101 compares the luminance of each of RGB with the plasma emission intensity, and creates the calibration curves A and D indicating the correlation between the luminance of "B (blue)" and the plasma emission intensity. The correlation information indicated by the calibration curves A and D is stored in the storage 103 in association with the process conditions.

The measurement results of the plasma parameter used to create the calibration curve (correlation information) may include the measurement results (actual measurement data) obtained by inserting the probe into the plasma. The measurement results of the plasma parameter may include the simulation results (simulation data) of the plasma parameter using the physical model of the plasma.

Accordingly, even when the number of actual data of the measured plasma parameter is small, the number of usable data can be supplemented by the simulation data. Accordingly, the accuracy of the correlation information indicated by the created calibration curve can be improved.

In the example of FIG. 5, the process conditions include a gas type or the combination of a gas type and a pressure. However, at least one of the process conditions may be associated with the optical information and the plasma parameter. For example, the optical information and the plasma parameters may be associated with a temperature (e.g., a plasma electron temperature, a stage temperature). Alternatively, the optical information and the plasma parameters may be associated with a single gas or a combination of gases.

(Plasma Parameter Estimation Process)

Next, a plasma parameter estimation process shown in FIG. 6 will be described. The plasma parameter estimation process shown in FIG. 6 is a part of an operation of a measurement method according to an embodiment. When the process of FIG. 6 is started, the imaging device 200 images the plasma generated under desired process conditions through the viewport 11, and generates the luminance of each of RGB under the desired process conditions based on the image data of the imaged plasma (step S11). The luminance of each of RGB generated in step S11 is transmitted to the controller 100.

The controller 100 (the calculator 101) acquires the luminance of each of RGB under the desired process conditions from the imaging device 200 (step S12). Next, the estimator 102 estimates the plasma emission intensity from the luminance of each of RGB with reference to the calibration curves that are stored in the storage 103 and satisfy the desired process conditions (step S13).

In step S13, the emission intensity of the two-dimensional plasma or the three-dimensional plasma may be estimated from the luminance of each of three-dimensional RGB included in the image data of the plasma. Alternatively, the emission intensity of the one-dimensional plasma or the two-dimensional plasma may be estimated from luminance of each of the one-dimensional RGB or the two-dimensional RGB.

For example, the imaging device 200 can generate the luminance of each of RGB of each space obtained by dividing the three-dimensional space from the image data of the plasma. The estimator 102 can estimate the plasma parameter of the three-dimensional space from the luminance of each of RGB of the plasma in each space obtained by dividing the three-dimensional space with reference to the storage 103 that stores the correlation information indicated by the calibration curves.

For example, as shown in FIG. 4B, the plasma parameters in the spaces $L_{1,1}$ to $L_{4,4}$ obtained by dividing the three-dimensional plasma processing space in the processing chamber 2 can be estimated, without plasma measurement, from the luminance of each of RGB in the spaces $L_{1,1}$ to $L_{4,4}$.

The estimated three-dimensional plasma parameters can be used to develop the plasma processing device 10, for example. Since the estimated three-dimensional plasma parameters are used, the score of the measurement data considerably increases compared to the plasma parameters measured by the conventional measurement method. Accordingly, the quality of plasma evaluation can be remarkably improved. Further, in the mass production line of the plasma processing device 10, the process conditions of the plasma processing device 10 can be autonomously controlled, and the process conditions can be automatically controlled depending on the evaluated plasma state.

FIGS. 7 and 8 are FIGS. 7 and 11 of Article titled "Optical emission spectroscopy in low-temperature plasmas containing argon and nitrogen: determination of the electron temperature and density by the line-ratio method" written by Xi-Ming Zhu and Yi-Kang Pu and published on 21 Sep. 2010.

FIGS. 7 and 8 show examples of the correlation between the optical information and the plasma parameters. For example, as shown in FIGS. 7A to 7D, when the pressure and the plasma generation method as the process conditions are changed, the wavelength intensity in the visible light wavelength range is changed even if the other process conditions are the same. In the example of FIGS. 7A to 7D, the pressure and the plasma generation method are changed, and the same argon gas is used. The emission occurs by chemical reaction in plasma, and the wavelength intensity in the visible light wavelength range changes depending on gas types.

As shown in FIGS. 8A to 8D, when the plasma is generated at different pressures by different plasma generation methods (ICP or CCP) using the same argon gas, the plasma electron density $N_e$ and the plasma electron temperature $T_e$ are different depending on the set pressure or the plasma generation method.

Therefore, if even one process condition such as a gas type, a pressure, a plasma generation method, or the like is changed, it is expected that the luminance of each of RGB in the plasma image data is changed. Accordingly, it is possible to estimate the plasma emission intensity, with reference to the calibration curves created for each process condition, from the luminance of each of RGB included in the image data of the plasma obtained during processing performed under certain process conditions.

<Machine Learning of Calibration Curve (Correlation Information)>

Figure 9:
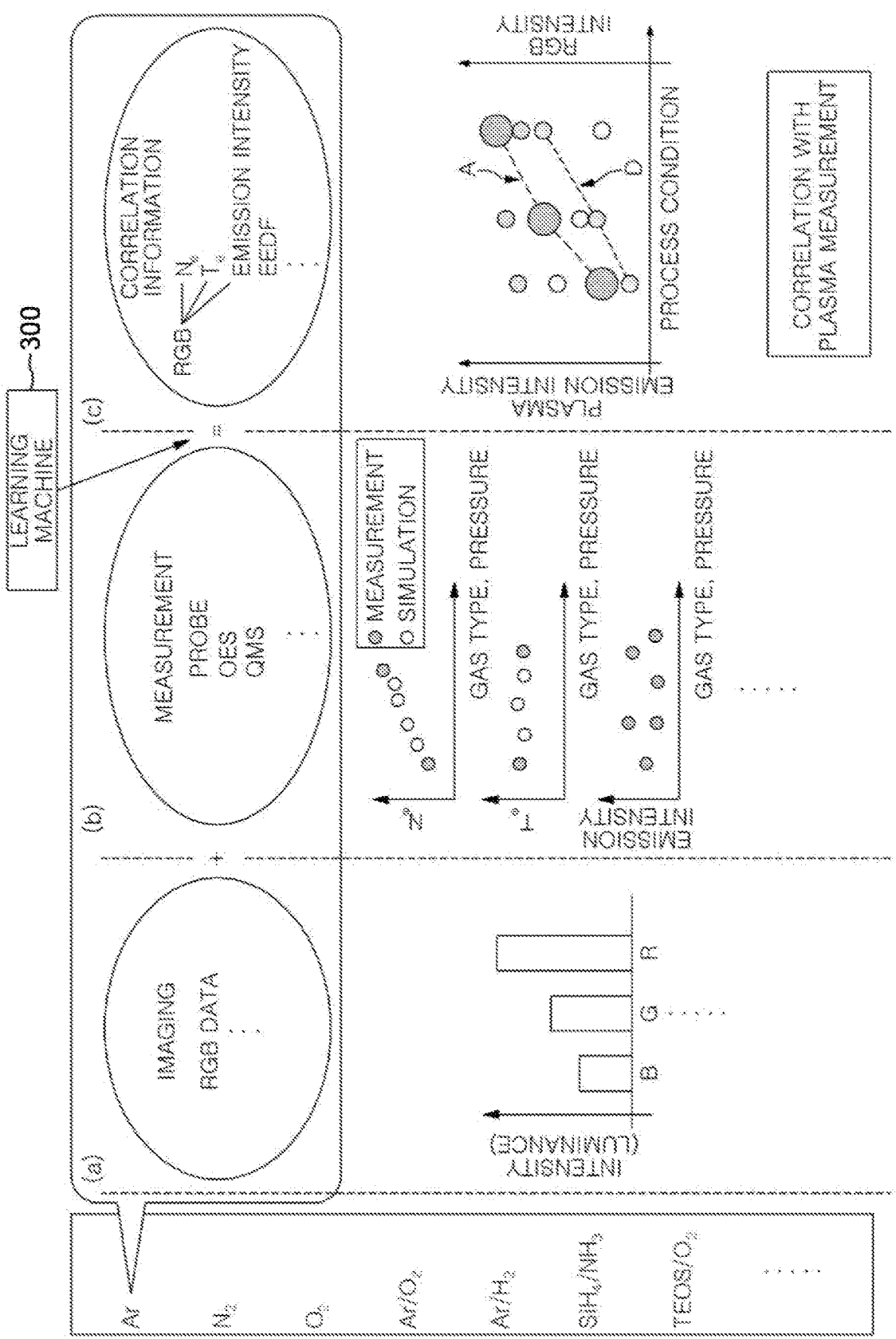
FIG. 9 explains calibration curve creation according to an embodiment.

The machine learning of the calibration curve created in the measurement method according to the above-described embodiment will be described with reference to FIG. 9. FIG. 9 explains calibration curve creation according to an embodiment.

In the example of FIG. 9, the plasma is generated while setting a gas type that is an example of the process conditions to Ar gas, $N_2$ gas, $O_2$ gas, $Ar/O_2$ gas, $Ar/H_2$ gas, $SiH_4/NH_3$ gas, $TEOS/O_2$ gas, or the like.

In this case, the controller 100 performs steps (a) to (c). The controller 100 obtains the luminance of each of RGB in the image data imaged by the imaging device 200 in the step (a). The controller 100 obtains the information on the results of the plasma measurement and/or the simulation using a probe or the like in the step (b). The plasma electron density $N_e$, the plasma electron temperature $T_e$, and the plasma emission intensity are described as examples of the results of the plasma measurement or the simulation, but the results of the plasma measurement or the simulation is not limited thereto. In the case where the plasma emission intensity is used as an example of the result of the plasma measurement or the simulation, the controller 100 detects the correlation between the luminance of each of RGB for each gas type and the plasma emission intensity in the step (c), and generates the correlation information corresponding to the calibration curves A and D of FIG. 9, for example. The correlation information does not necessarily indicate the correlation between the luminance of each of RGB and the plasma emission intensity, and may indicate the correlation between the optical information of the plasma generated under predetermined process conditions and the measurement results of the plasma parameter and/or the simulation results of the plasma parameter. The luminance of each of RGB is an example of the optical information of the plasma generated under predetermined process conditions. For example, the correlation information may indicate the correlation between each luminance of RGB and the plasma electron density $N_e$. Alternatively, the correlation information may indicate the correlation between each luminance of RGB and the plasma electron temperature $T_e$. Alternatively, the correlation information may indicate the correlation between the optical information of the plasma and other plasma parameters.

A learning machine 300 may be used to generate the correlation information. In this case, the correlation information may be generated by inputting to the learning machine 300, as a data set, predetermined process conditions, the optical information of the plasma generated under the predetermined process conditions, and the measurement results of the plasma parameters.

The controller 100 may input to the learning machine 300, as a data set, the combination of the plasma parameter simulation results obtained to supplement the measurement results and the position data of the three-dimensional space in the processing chamber 2 where the plasma parameter is obtained. The controller 100 may input to the learning machine 300, as a data set, the combination of the measurement results of the plasma parameter and the position data of the three-dimensional space in the processing chamber 2 where the plasma parameter is obtained. Accordingly, the learning machine 300 can learn the correlation between the luminance of each of RGB of an input position (e.g., determining the position of the space $L_{1,1}$ or the like in FIG. 4B) and the plasma parameter at the input position while using, as a data set, the input position and the plasma parameter at the input position, so that the correlation information can be more appropriately generated.

For example, FIG. 4A shows a case in which it was determined that the plasma emission intensity is correlated with the luminance of "B (blue)" and the correlation information corresponding to the calibration curves A and D was generated. However, the correlation information can be more appropriately generated in consideration of the correlation between the emission intensity and the luminance of "R (red)" or the luminance of "G (green)" by machine learning. Accordingly, the plasma parameter can be estimated with a higher accuracy from the luminance of each of RGB in a newly imaged image with reference to the more appropriately generated correlation information.

As described above, in accordance with the measurement system and the measurement method executed by the measurement system according to the embodiments, the plasma parameter can be easily acquired. Further, the three-dimensional plasma parameter can be simply estimated with reference to the correlation information indicating the correlation between the optical information of the plasma obtained from the image data of the three-dimensional plasma P by the integral photography technique and the measurement results of the plasma parameter.

The measurement system, the measurement method, and the plasma processing device according to the embodiments of the present disclosure are considered to be illustrative in all respects and not restrictive. The above-described embodiments can be changed and modified in various forms without departing from the scope of the appended claims and the gist thereof. The above-described embodiments may include other configurations without contradicting each other and may be combined without contradicting each other.

The plasma processing device of the present disclosure may be applied to any type of apparatus such as a capacitively coupled plasma (CCP) processing apparatus, an inductively coupled plasma (ICP) processing apparatus, an apparatus using microwave plasma (MWP), an electron cyclotron resonance plasma (ECR) processing apparatus, and a helicon wave plasma (HWP) processing apparatus.

Further, the plasma processing device may be any device that performs predetermined plasma processing (e.g., film formation, etching, or the like) on the substrate.

This application claims priority to Japanese Patent Application No. 2020-021614 filed on Feb. 12, 2020, the entire contents of which are incorporated herein by reference.

DESCRIPTION OF REFERENCE NUMERALS

2: processing chamber
3: upper electrode
4: lower electrode
5: electrostatic chuck
6: first RF power supply
7: second RF power supply
8: gas supplier
9: exhauster
10: plasma processing device
11: viewport
12: optical fiber
13: optical emission spectrometer
20: imaging part
21: imaging lens
22: microlens array
23: imaging element
24: microlens
100: controller
200: imaging device
ST: stage
P: plasma

The invention claimed is:

1. A measurement system including an imaging device and a plasma processing device having a plasma generator configured to generate plasma from a gas supplied into a processing chamber and a controller,
wherein the imaging device has a microlens array and multiple imaging elements, and is configured to generate luminance of each of RGB in each space obtained by dividing a three-dimensional space where the plasma is generated in the processing chamber from image data of imaged plasma in the processing chamber, and
the controller is configured to estimate a plasma emission intensity of the three-dimensional space by converting the generated luminance of each of RGB in each of the space into a plasma emission intensity with reference to a storage that stores correlation information between the luminance of each of RGB in each of the space and measurement results of the plasma emission intensity.

2. The measurement system of claim 1, wherein the imaging device is configured to generate the optical information of the plasma under predetermined process conditions from the image data of the plasma generated under the predetermined process conditions, and
the controller is configured to convert the generated optical information of the plasma under the predetermined process conditions with reference to the storage that stores the correlation information between the optical information of the plasma for each process condition and the measurement results of the plasma parameter for each process condition.

3. The measurement system of claim 2, wherein the process conditions include type of the gas supplied into the processing chamber, and further include at least one of a power applied to the processing chamber, a pressure in the processing chamber, a temperature in the processing chamber, or a method for generating plasma in the processing chamber.

4. The measurement system of claim 3, wherein the process conditions, the optical information of the plasma generated under the process conditions, and the measurement results of the plasma parameter are inputted, as a data set, to a learning machine, and the correlation information outputted from the learning machine is stored in the storage.

5. The measurement system of claim 4, wherein position information on a three-dimensional space in the processing chamber where the measurement results of the plasma parameter and/or simulation results of the plasma parameter are obtained is combined with the plasma parameter and inputted, as the data set, to the learning machine.

6. The measurement system of claim 1, wherein the measurement results of the plasma parameter include the plasma parameter obtained by measuring the generated plasma.

7. The measurement system of claim 1, wherein the measurement results of the plasma parameter include the plasma parameter obtained by simulation.

8. A measurement method for measuring plasma generated from a gas supplied into a processing chamber of a plasma processing device, comprising:
generating luminance of each of RGB in each space obtained by dividing a three-dimensional space where the plasma is generated in the processing chamber from image data of the plasma in the processing chamber that is imaged by an imaging device, the imaging device having a microlens array and multiple imaging elements; and
estimating a plasma emission intensity of the three-dimensional space by converting the generated luminance of each of RGB in each of the space into a plasma emission intensity with reference to a storage that stores correlation information between the luminance of each of RGB in each of the space and measurement results of the plasma emission intensity.

9. A plasma processing device having a plasma generator configured to generate plasma from a gas supplied into a processing chamber and a controller,
wherein the controller is configured to
obtain luminance of each of RGB in each space obtained by dividing a three-dimensional space where the plasma is generated in the processing chamber from image data of the plasma in the processing chamber that is imaged by an imaging device, the imaging device having a microlens array and multiple imaging elements, and
estimate a plasma emission intensity of the tree-dimensional space by converting luminance of each of RGB in each of the space into a plasma emission intensity with reference to a storage that stores correlation information between the luminance of each of RGB in each of the space and measurement results of the plasma emission intensity.

* * * * *